US006265284B1

(12) United States Patent
Kim (10) Patent No.: US 6,265,284 B1
(45) Date of Patent: Jul. 24, 2001

(54) METHOD OF MANUFACTURING A TRENCH ISOLATION REGION IN A SEMICONDUCTOR DEVICE

(75) Inventor: Sung-bong Kim, Suwon (KR)

(73) Assignee: Samsung Electronics Co., Ltd. (JP)

( * ) Notice: Subject to any disclaimer, the term of this patent is extended or adjusted under 35 U.S.C. 154(b) by 0 days.

(21) Appl. No.: 09/399,705

(22) Filed: Sep. 21, 1999

(30) Foreign Application Priority Data

Sep. 21, 1998 (KR) .................................................. 98-38987

(51) Int. Cl.⁷ ...................................................... H01L 21/76
(52) U.S. Cl. ............................ 438/424; 438/296; 438/435
(58) Field of Search .................................. 438/296, 424, 438/435

(56) References Cited

U.S. PATENT DOCUMENTS

| 4,571,819 | * | 2/1986 | Rogers et al. | 29/576 |
| 5,561,073 | * | 10/1996 | Jerome et al. | 438/404 |
| 5,719,085 | * | 2/1998 | Moon et al. | 438/424 |
| 5,872,045 | * | 2/1999 | Lou et al. | 438/432 |
| 5,960,298 | * | 9/1999 | Kim | 438/424 |
| 5,976,951 | * | 11/1999 | Huang et al. | 438/435 |
| 5,989,978 | * | 11/1999 | Peidous | 438/436 |
| 6,033,970 | * | 3/2000 | Park | 438/424 |
| 6,037,018 | * | 3/2000 | Jang et al. | 438/424 |
| 6,074,927 | * | 6/2000 | Kepler et al. | 438/424 |
| B1 6,180,490 | * | 1/2001 | Vassiliev et al. | 438/424 |

FOREIGN PATENT DOCUMENTS

| 7-176607 | | 7/1995 | (JP) . |
| 216267 B1 | * | 6/1998 | (KR) ........................... H01L/21/76 |

* cited by examiner

Primary Examiner—Charles Bowers
Assistant Examiner—David S Blum
(74) Attorney, Agent, or Firm—Cantor Colburn LLP

(57) ABSTRACT

A method of manufacturing a semiconductor device in which a groove is not formed at edges of a trench isolation region is provided. The semiconductor device includes an active region and a trench isolation region formed on a semiconductor substrate. The trench isolation region is comprised of a side wall insulation layer which is a thermal oxide, an exposure prevention layer which is a high temperature oxide, and an insulator burial layer which is a low temperature oxide. The densified exposure prevention layer is formed between the side wall insulation layer and the insulator burial layer, thereby preventing a groove exposing the surface of the semiconductor substrate from being formed between the active region where a gate electrode is formed and the trench isolation region. Therefore, when a voltage less than a threshold voltage is applied to the gate electrode, a channel is not formed under the gate electrode, thereby preventing current flow.

14 Claims, 5 Drawing Sheets

METHOD OF MANUFACTURING A TRENCH ISOLATION REGION IN A SEMICONDUCTOR DEVICE

BACKGROUND OF THE INVENTION

1. Field of the Invention

The present invention relates to a semiconductor device and a manufacturing method therefor, and more particularly, to a semiconductor device having a trench isolation region and a manufacturing method therefor.

2. Description of the Related Art

In a semiconductor integrated circuit, a LOCOS (LOCal Oxidation of Silicon) process in which a semiconductor substrate is oxidized using a nitride as a mask is used for isolating devices. Since an isolation layer formed by the LOCOS process is a thermal oxide, it is a densified film but ensures a low level of integration. According to the recent high integration of a semiconductor integrated circuit, a shallow trench isolation technology is widely used for overcoming the limit of integration levels of devices in case of using isolation layers formed by the LOCOS process. Hereinbelow, a conventional semiconductor device of the prior art having a trench isolation region will be described with reference to FIG. 1A–1D.

Figure 1A:
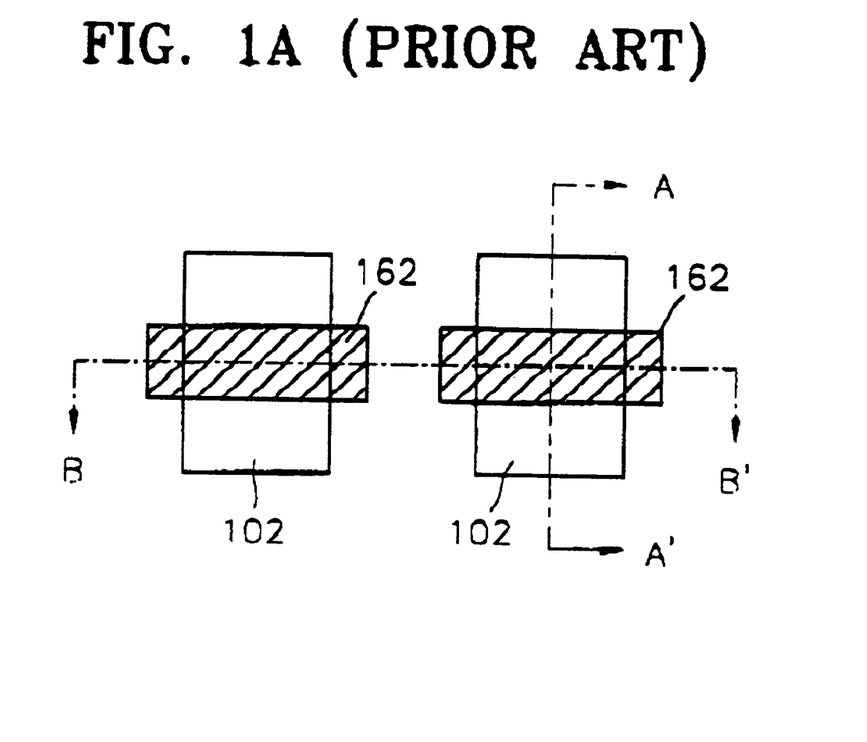
FIG. 1A is a layout diagram illustrating an active region and a gate electrode of a conventional semiconductor device of the prior art.
Figure 1B:
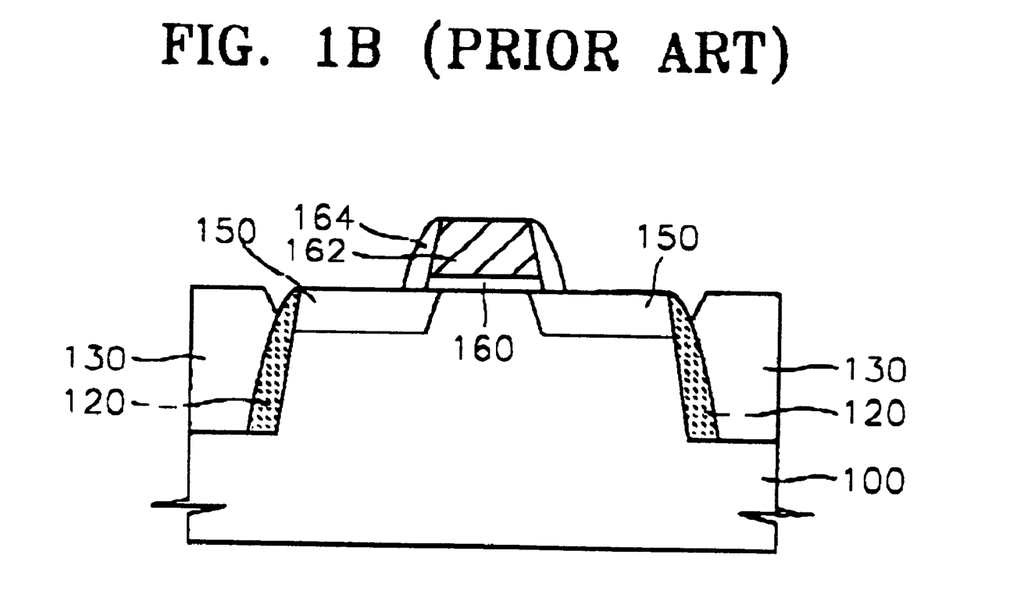
FIGS. 1B and 1C are cross-sectional views taken along lines A–A' and B–B', of FIG. 1A, respectively.

FIG. 1A is a layout diagram of an active region pattern 102 and a gate electrode pattern 162. FIG. 1B is a cross-sectional view taken along A–A' direction of FIG. 1A. Referring to FIG. 1B, an isolation region and an active region are formed on a semiconductor substrate 100. Source/drain 150, a gate insulation layer 160, a gate electrode 162 and a gate spacer 164 are formed in the active region. Also, a side wall insulation layer 120 and an insulator burial layer 130 are formed in the trench isolation area.

Figure 1C:
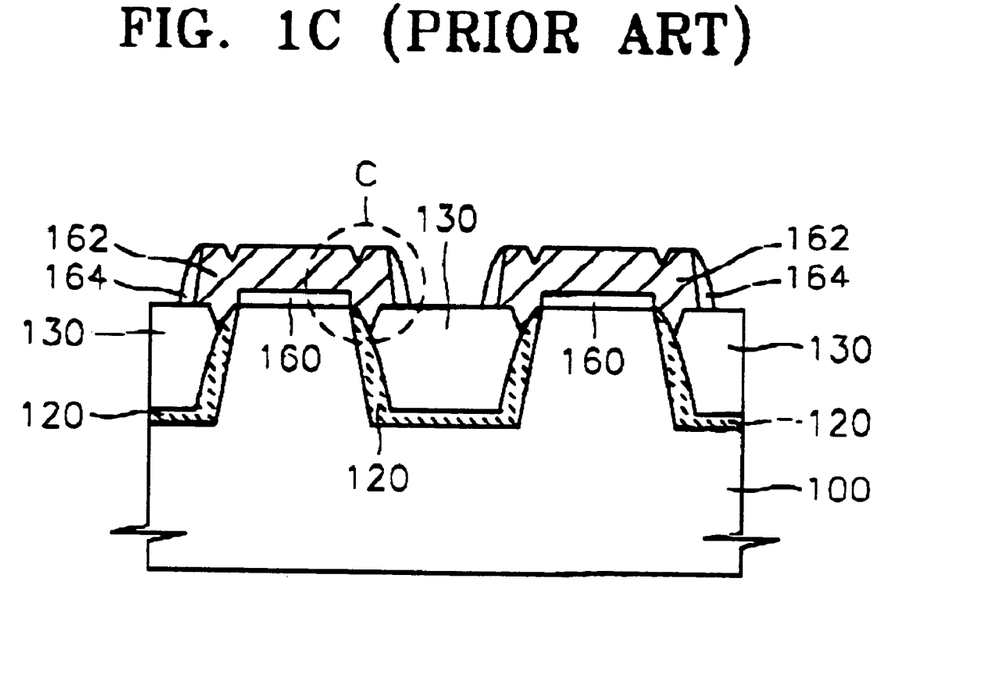
Figure 1D:
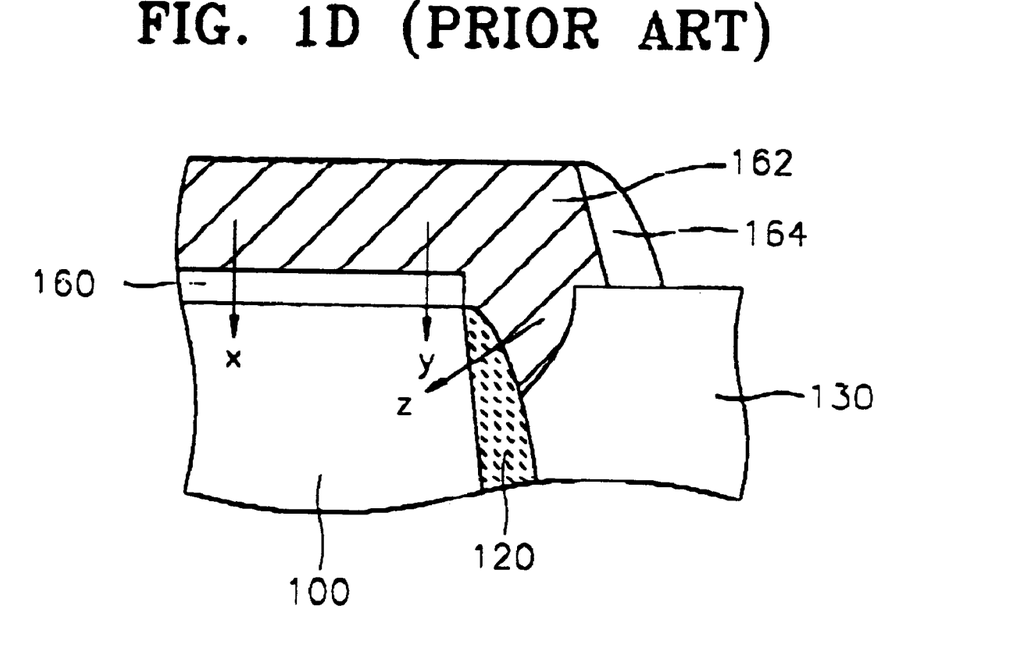
FIG. 1D is an enlarged cross-sectional view of a region C of FIG. 1C.

FIG. 1C is a cross-sectional view taken along B–B' direction of FIG. 1A. Referring to FIG. 1C, the side wall insulation layer 120 is formed at the side walls and on the bottom of a trench, and the insulator burial layer 130 for filling the trench is formed. Also, the gate electrode 162 is formed on the active region. A fabrication process of the semiconductor device will be described briefly. First, a buffer layer (not shown) and a photosensitive layer (not shown) are formed on the semiconductor substrate 100 and patterned. A non-active region is etched using the patterned buffer layer and the patterned photosensitive layer as a mask to form a trench. Next, the side wall insulation layer 120 is formed at the side walls and on the bottom of the trench and then the insulator burial layer 130 is formed. Next, a wet etch process is performed for removing the buffer layer. Here, since the buffer layer is formed by thermally oxidizing the semiconductor substrate 100, the buffer layer bonding structure is densified film. However, the insulator burial layer 130 for burying the trench is an oxide formed by performing a chemical vapor deposition process at a low temperature. Thus, the insulator burial layer 130 is less denser than that of the buffer layer. As a result, when performing the wet etch process for removing the buffer layer, the insulator burial layer 130 is etched away 2–5 times faster than the buffer layer. Also, since edges of the insulator burial layer 130 adjacent to the active region are simultaneously etched at the side walls and on the upper surface thereof, the edges are etched away more than the central portion. Thus, as indicated by a region C in FIG. 1C, the edges of the insulator burial layer 130 are etched more deeply than the surface of the active region so that an undesired groove is formed. FIG. 1D is an enlarged cross-sectional view of the region C shown in FIG. 1C. The gate electrode 162 is formed on the active region and at the side walls of the active region where the groove is formed.

Now, the operation of the device will be described. If power greater than a threshold voltage is applied to the gate electrode 162, a channel is formed in the active region below the gate insulation layer 160, which causes current to flow from the source to the drain. However, as shown in FIG. 1D, if the undesired groove is formed at the edges of the insulator burial layer 130, the gate electrode 162 is formed on top of and at the side walls of the active region. As a result, if a voltage is applied to the gate electrode 162, only a vertical electric field x ranging toward the upper surface of the active region is induced in the central portion of the active region. However, in the edges of the active region, both a vertical electric field y ranging toward the upper surface of the active region and a side wall electric field z ranging toward the side wall of the active region of the gate electrode 162 are induced. Thus, even if a voltage lower than a threshold voltage is applied to the gate electrode 162, a stronger electric field is induced in the edge portion of the active region than in the central portion. As a result, even if a voltage lower than the threshold voltage is applied to the gate electrode 162, a channel is induced in the edge portion of the active region, so that unwanted current flows from the source to the drain.

To solve the problem, that is, the device is turned on at the voltage lower than the threshold voltage, the formation of the groove in the edges of the insulator burial layer 130 must be suppressed. To this end, a wet etch time is minimized in the conventional art. However, in this case, it is difficult to keep a constant concentration of an etching solution used in the wet etch process, thereby disabling to obtain the same resultant structure.

SUMMARY OF THE INVENTION

To solve the above problems, it is an objective of the present invention to provide a method of manufacturing a semiconductor device having a trench isolation region in which a groove is not formed at edges of an insulator burial layer.

To achieve the objective, there is provided a method for manufacturing a semiconductor device comprising the steps of forming a trench by etching a predetermined portion of a semiconductor substrate, recovering the surface of the semiconductor substrate damaged due to the etching by forming a side wall insulation layer at side walls and on a bottom portion of the trench, forming an exposure prevention layer on the side wall insulation layer to prevent the side walls of the trench from being exposed to subsequent etching, and forming an insulator burial layer by depositing an insulator into the trench where the side wall insulation layer and the exposure prevention layer are formed.

At this time, the formation of the side wall insulation layer is performed by thermal oxidation. Also, the exposure prevention layer is preferably formed of a high temperature oxide (HTO) by performing a chemical vapor deposition process and the chemical vapor deposition process is performed at a temperature of 800° C. or above. The formation of the exposure prevention layer includes depositing polysilicon over the entire surface of the semiconductor substrate where the side wall insulation layer is formed, and thermally oxidizing the deposited polysilicon.

The insulator burial layer is preferably formed by performing a chemical vapor deposition process and the insulator burial layer is formed at a low temperature of 400° C. or below.

Also, after the formation of the insulator burial layer, the semiconductor substrate is annealed at a temperature of 900–1100° C.

In the semiconductor device according to the present invention, a densified exposure preventing layer is formed between the side wall insulation layer and the insulator burial layer, so that a groove exposing the surface of the semiconductor substrate is not formed between the active region where the gate electrode is formed and the trench isolation region. As a result, since only the vertical electric field is induced at edges of the gate electrode, a channel is not formed below the gate electrode when a voltage less than a threshold voltage, thereby preventing the device from being turned on.

BRIEF DESCRIPTION OF THE DRAWINGS

The above objectives and advantages of the present invention will become more apparent by describing in detail a preferred embodiment thereof with reference to the attached drawings in which.

DESCRIPTION OF THE PREFERRED EMBODIMENTS

Hereinbelow, preferred embodiments of the present invention will be described in detail with reference to the accompanying drawings. However, the present invention is not limited to the following embodiments and they are provided only for perfecting the disclosure of the invention, and various changes and modifications may be made by those who have ordinary skills in the art within the spirit and scope of the invention. Also, in drawings, the thickness of layers and regions are exaggerated for clarity. Like numbers refer to like elements throughout. Also, when a layer is said to exist on another layer or a substrate, the layer may exist directly on the other layer or substrate, and it is within the scope of the present invention that an interlayer film may be present therebetween.

Figure 2:
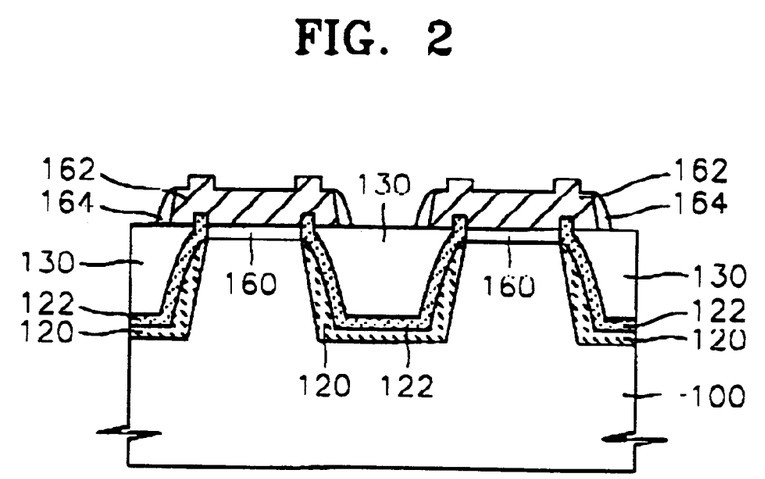
FIGS. 2 and 3 are cross-sectional views of a semiconductor device having a trench isolation region according to a preferred embodiment of the present invention.

Referring to FIG. 2, which illustrates a first embodiment of a semiconductor device having a trench isolation region, wherein an active region and a trench isolation region are formed on a semiconductor substrate 100. A side wall insulation layer 120, an exposure preventing layer 122 and an insulator burial layer 130 are sequentially formed at side walls of and on bottom of a trench. The insulator burial layer 130 formed on the side wall insulation layer 120 and the exposure preventing layer 122 fills the inside of the trench. Here, the trench is preferably formed of a depth of 3000–9000 Å. Also, a gate insulation layer 160 and a gate electrode 162 are sequentially formed on the active region. Also, a gate spacer 164 is formed at side walls of the gate electrode 162.

The side wall insulation layer 120 is a thermal oxide layer formed by thermally oxidizing the semiconductor substrate 100 and the thickness thereof is preferably 200–500 Å. The side wall insulation layer 120 is for removing damage applied to the semiconductor substrate 100 due to a dry etch process for forming the trench, e.g., crystalline defects. In other words, the side wall insulation layer 120 is formed by thermally oxidizing the surface of the semiconductor substrate 100 damaged by the etch process. Silicon consisting of the surface of the damaged semiconductor substrate 100 is consumed during thermal oxidation so that the crystalline defects are removed. Also, the side wall insulation layer 120 is a densified thermal oxide.

The exposure preventing layer 122 is preferably a high temperature oxide formed by performing a CVD process at a high temperature of 800° C. or above. Also, the exposure preventing layer 122 is a densified high temperature oxide. Also, the thickness of the exposure preventing layer 122 is preferably 500–2000 Å, and is preferably thicker than the side wall insulation layer 120. Thus, during the wet etch process, the densified exposure preventing layer 122 is etched to a lesser degree than the less densified insulator burial layer 130. As a result, the top surface of the densified exposure preventing layer 122 may protrude with respect to the surface of the active region and the surface of the insulator burial layer 130. In the present invention, the exposure preventing layer 122 is formed, thereby suppressing a generation of groove at edges of the insulator burial layer 130, unlike in the conventional semiconductor device.

The insulator burial layer 130 is a low temperature oxide formed by performing a CVD process at a low temperature of 400° C. or below. Thus, the insulator burial layer 130 is less denser than that of the exposure preventing layer 122. However, the insulator burial layer 130 can completely fill the inside of the trench by performing the CVD process at a low temperature.

Figure 3:
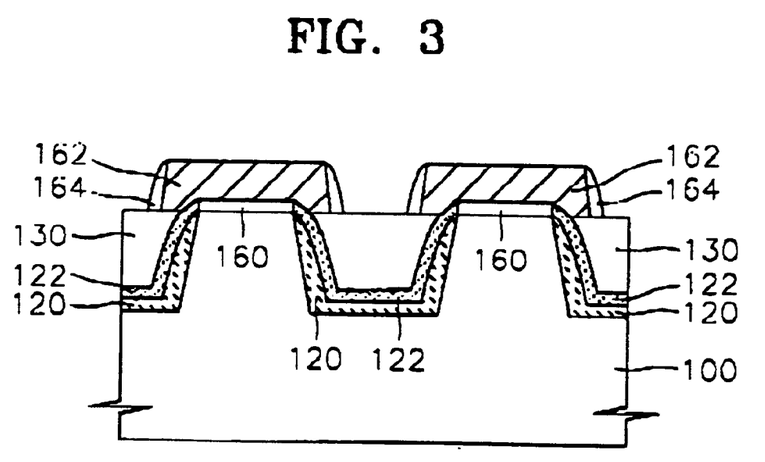

FIG. 3 is a cross-sectional view illustrating the semiconductor device in which the top surface of the exposure preventing layer 122 is over-etched so that it does not protrude with respect to the surface of the insulator burial layer 130 and the surface of the active region. However, since the thick exposure preventing layer 122 is formed between the insulator burial layer 130 and the side wall insulation layer 120, a groove is not formed at edges of the insulator burial layer 130.

If a voltage is applied to a gate electrode of a semiconductor device according to the present invention, only the vertical electric field ranging from the gate electrode to an active region is applied to the edges of the gate electrode as well as the central region thereof. Therefore, unlike in the conventional semiconductor device, if a voltage less than a threshold voltage is applied to the semiconductor device according to the present invention, the device is not turned on.

In accordance with the present invention, a second embodiment of a semiconductor device having a trench isoltation region is presented. This second embodiment is different from the first embodiment in that the exposure preventing layer 122 is a thermal oxide formed by thermally oxidizing polysilicon deposited on the side wall insulation layer 120. Thus, since the connection structure of the exposure preventing layer 122 is constituted of densified layer, the same effects as those of the first embodiment can be obtained.

Figure 4A:
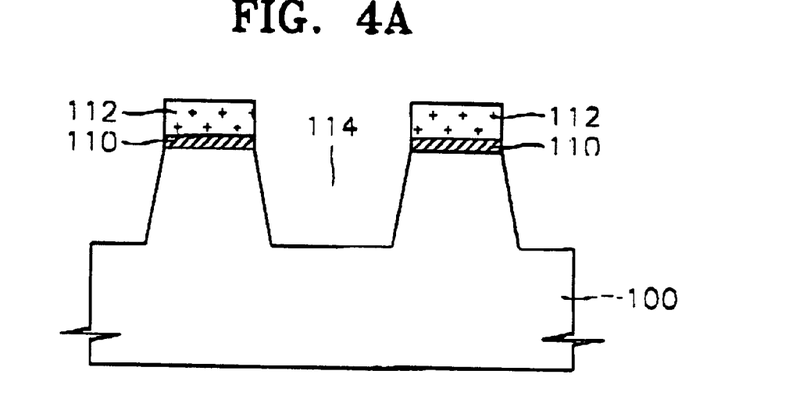
FIGS. 4A through 4E are cross-sectional views sequentially illustrating a method for manufacturing a semiconductor device having a trench isolation region according to the present invention.

The present invention further presents a method for manufacturing a semiconductor device having a trench isolation region. Referring to FIG. 4A, which illustrates a method of a first embodiment, wherein a buffer layer 110 and a mask insulation layer 112, e.g., silicon nitride, are sequentially formed on a semiconductor substrate 100. Here, the buffer layer 110 is preferably a silicon oxide formed by thermal oxidation. Next, a portion at which an active region is to be formed is defined by patterning the buffer layer 110 and the mask insulation layer 112. A trench 114 is formed by dry-etching a predetermined area of the semiconductor substrate 100 using the patterned buffer layer 110 and the patterned mask insulation layer 112. The trench is preferably formed to a depth of 3000–9000 Å and is used as an isolation region. Here, since the buffer layer 110 is formed by thermal oxidation, the buffer layer 110 is densified layer. Also, the buffer layer 110 prevents defects which may be generated on the semiconductor substrate 100 due to stress of a silicon nitride when the silicon nitride as the mask insulation layer 112 is directly formed on the semiconductor substrate 100, and improves adhesion property of the semiconductor substrate 100 with respect to the silicon nitride.

Figure 4B:
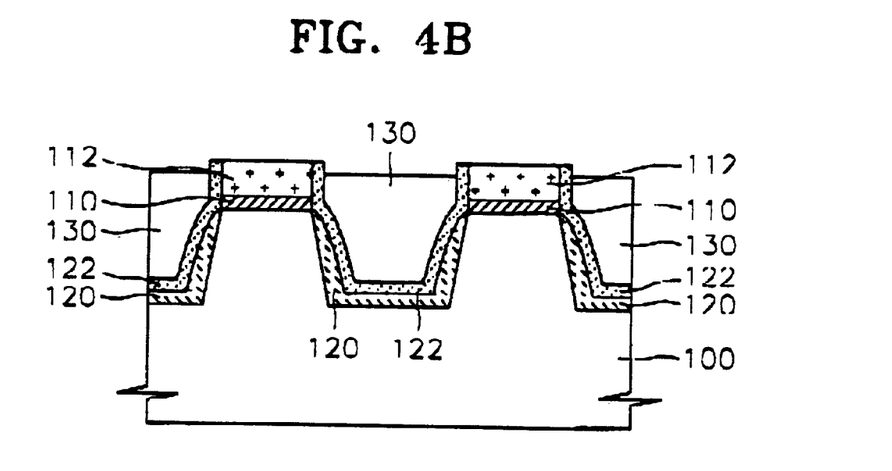

Referring to FIG. 4B, a side wall insulation layer 120 is formed at side walls and on the bottom surface of a trench 114 by thermally oxidizing the semiconductor substrate 100 where the trench 114 is formed. Here, the side wall insulation layer 120 is preferably formed to a thickness of 200–500 Å. Then the exposure preventing layer 122 is formed over the entire surface of the semiconductor substrate 100 where the side wall insulation layer 120 is formed. Preferably, the exposure preventing layer 122 is formed by performing a CVD process at a high temperature of 800° C. or above. More preferably, the exposure preventing layer 122 is a high temperature oxide. Also, the exposure preventing layer 122 is preferably at least twice as thick as the buffer layer 110 and at least as thick as the side wall insulation layer 120. Thus, the exposure preventing layer 122 is preferably formed to a thickness of 500–2000 Å. Next, an insulator burial layer 130 is formed by performing a CVD process at a low temperature of 400° C. or below. The insulator burial layer 130 on which the CVD process is performed at a low temperature is a less densified layer, but can completely fill the inside of the trench 114. Next, the semiconductor substrate 100 where the insulator burial layer 130 is formed is annealed at a temperature of 900–1100° C. to densify the silicon oxide constituting the insulator burial layer 130. Next, the surface on which the insulator burial layer 130 is deposited is planarized using the top surface of the silicon nitride 112 as an etch stop layer. Here, the planarization is preferably performed by a chemical mechanical polishing (CMP) process.

Figure 4C:
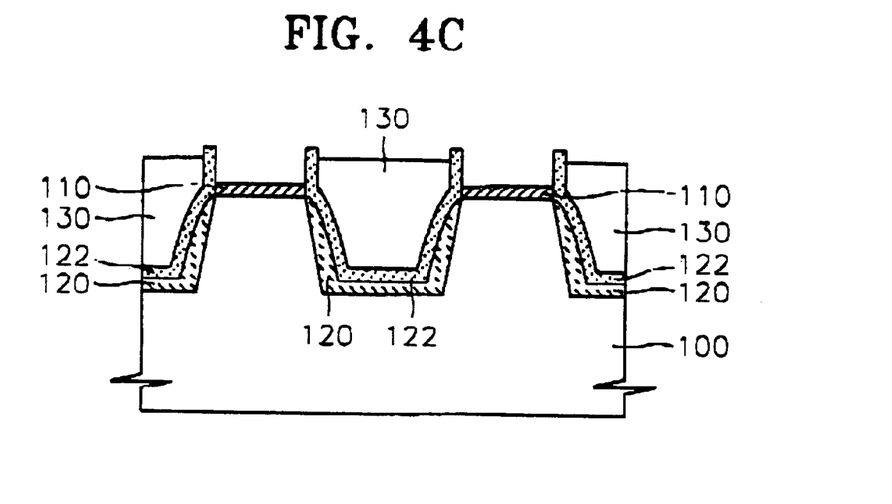

Referring to FIG. 4C, the mask insulation layer 112 is removed using phosphoric solution.

Figure 4D:
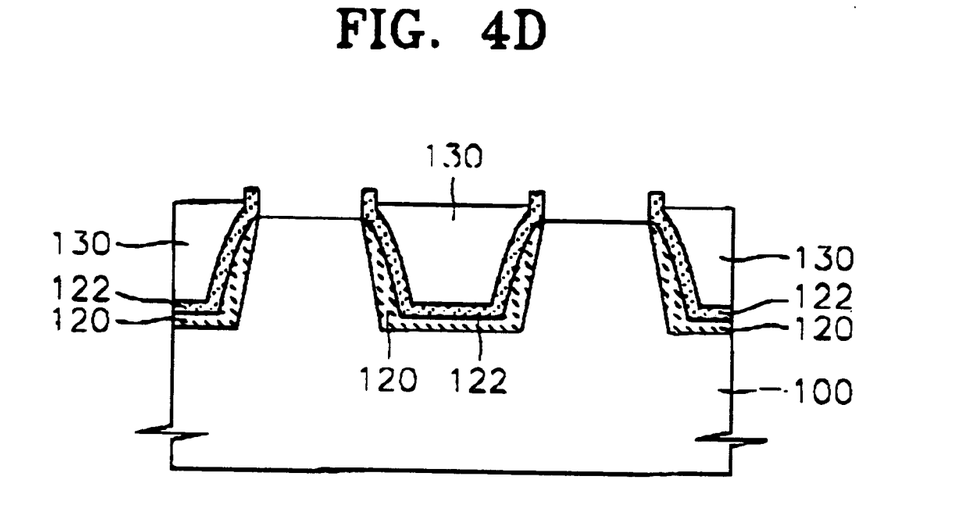

Referring to FIG. 4D, the buffer layer 110 is removed using dilute fluoric acid. While the buffer layer 110 is etched, the upper portions of the insulator burial layer 130 and the exposure prevention layer 122 are also etched. Here, the etching degrees of the respective layers are different depending on their denseness. In other words, the less densified insulator burial layer 130 is etched 2–5 times more than the densified buffer layer 110. However, the dense exposure preventing layer 122 is etched to a similar degree to the buffer layer 110. As result, the top surface of the exposure prevention layer 122 protrudes with respect to the surface of the active region and the surface of the insulator burial layer 130. Also, a groove due to etching is not formed at edges of the insulator burial layer 130. In other words, since the exposure prevention layer 122 is formed between the insulator burial layer 130 and the side wall insulation layer 120 to a constant thickness, a groove is not formed at edges of the insulator burial layer 130. If the buffer layer 110 is over-etched, the top surface of the exposure prevention layer 122 does not protrude.

Figure 4E:
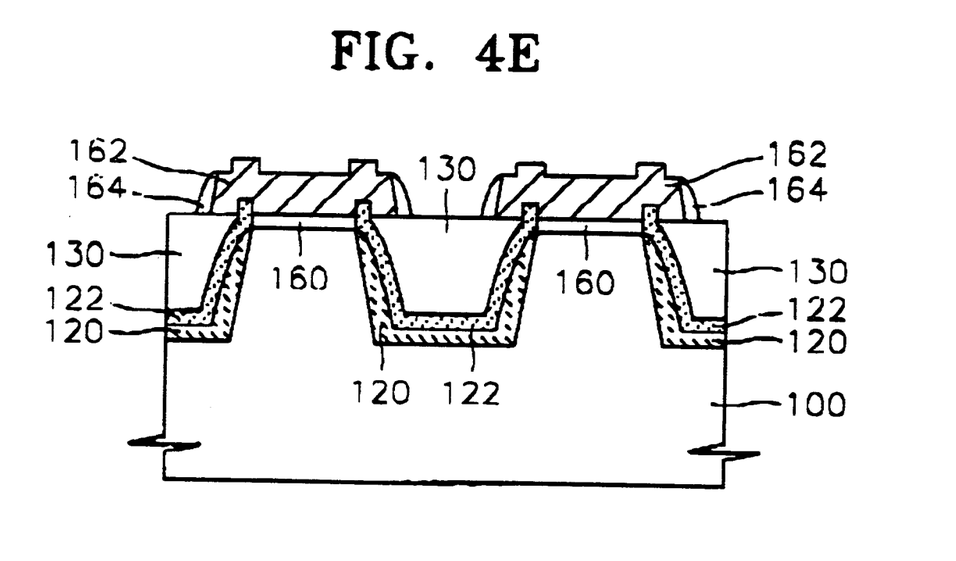

Referring to FIG. 4E, a gate insulation layer 160 and a gate electrode 162 are formed on a predetermined portion of the active region. Next, a gate spacer is formed at lateral surfaces of the gate electrode 162. Here, since a groove is not formed at edges of the active region, the gate electrode 162 is formed only on the active region but is not formed at side walls of the active region, unlike in the conventional art.

In accordance with the present invention, a second embodiment of a method for manufacturing a semiconductor device having a trench isolation region is presented. This second embodiment is different from the first embodiment in that polysilicon layer is deposited over the entire surface of the semiconductor substrate where the side wall insulation layer 120 is formed and then the deposited polysilicon is thermally oxidized to form an exposure prevention layer 122. The subsequent processes are the same as those in the first embodiment.

As described above, in the semiconductor device formed by the method according to the present invention, since a densified exposure prevention layer is formed between a side wall insulation layer and an insulator burial layer, a groove exposing the surface of a semiconductor substrate is not formed between an active region where a gate electrode is formed and a trench isolation region. As a result, the gate electrode is formed only on the active region and is not formed at side walls of the active region. Therefore, if a voltage is applied to the gate electrode, since only a vertical electric field is formed at edges of the active region, an undesired channel is not formed at edges of the active region, thereby preventing current from flowing at a voltage lower than a threshold voltage.

What is claimed is:

1. A method for manufacturing a semiconductor device comprising:

forming a trench by etching a portion of a semiconductor substrate;

recovering the surface of the semiconductor substrate damaged due to etching by forming a side wall insulation layer at side walls and on a bottom portion of the trench;

forming an exposure prevention layer of oxide on the side wall insulation layer to prevent the side walls of the trench from being exposed to a subsequent etching; and forming an insulator burial layer by depositing an insulator into the trench where the side wall insulation layer and the exposure prevention layer are formed, the insulator burial layer being formed less dense than the exposure prevention layer.

2. The method according to claim 1, wherein the side wall insulation layer is formed by thermal oxidation.

3. The method according to claim 1, wherein the side wall insulation layer is formed to a thickness of 200–500 Å.

4. The method according to claim 1, wherein the exposure prevention layer is formed by a chemical vapor deposition process.

5. The method according to claim 4, wherein the chemical vapor deposition process is performed at a temperature of 800° C. or above.

6. The method according to claim 1, wherein the forming the exposure prevention layer comprises:

depositing polysilicon over the entire surface of the semiconductor substrate where the side wall insulation layer is formed; and thermally oxidizing the deposited polysilicon.

7. The method according to claim 1, wherein the exposure prevention layer is formed to a thickness of 500–2000 Å.

8. The method according to claim 1, wherein the insulator burial layer is formed by a chemical vapor deposition process.

9. The method according to claim 8, wherein the insulator burial layer is formed at a low temperature of 400° C. or below.

10. The method according to claim 8, wherein after forming the insulator burial layer, the semiconductor substrate is annealed at a temperature of 900–1100° C.

11. The method according to claim 1, wherein the forming the trench comprises:

sequentially depositing a buffer layer and a mask insulation layer on the semiconductor substrate;

patterning the mask insulation layer and the buffer layer; and forming the trench by etching the semiconductor substrate using the patterned buffer layer and mask insulation layer as a mask, and wherein the forming the insulator burial layer is followed by planarizing the insulator burial layer by a CMP process and removing the mask insulation layer and the buffer layer.

12. The method according to claim 11, wherein the exposure prevention layer is at least twice as thick as the buffer layer, and at least as thick as the side wall insulation layer.

13. The method according to claim 11, wherein upper portions of the exposure prevention layer and the insulator burial layer are simultaneously etched while the buffer layer is removed.

14. The method according to claim 13, wherein in removing the buffer layer, the exposure prevention layer and the insulator burial layer, the insulator burial layer is etched more than the buffer layer and the exposure prevention layer is etched less than the insulator burial layer.

* * * * *

UNITED STATES PATENT AND TRADEMARK OFFICE
CERTIFICATE OF CORRECTION

PATENT NO. : 6,265,284 B1  
APPLICATION NO. : 09/399705  
DATED : July 24, 2001  
INVENTOR(S) : Sung-bong Kim Page 1 of 1

It is certified that error appears in the above-identified patent and that said Letters Patent is hereby corrected as shown below:

Title Page:
Item (73) Assignee, delete "(JP)" and insert therefor -- (KR) --

Column 1:
Line 55, before "than that of" delete "denser" and insert therefor -- dense --

Column 6:
Line 66, after "wherein" delete "the"

Signed and Sealed this

Seventeenth Day of July, 2007

JON W. DUDAS  
*Director of the United States Patent and Trademark Office*